(12) United States Patent
Choi et al.

(10) Patent No.: US 11,232,987 B2
(45) Date of Patent: Jan. 25, 2022

(54) METHOD FOR FABRICATING A SEMICONDUCTOR DEVICE

(71) Applicant: SAMSUNG ELECTRONICS CO., LTD., Suwon-si (KR)

(72) Inventors: Sang-Il Choi, Yongin-si (KR); Hee Seok Nho, Asan-si (KR); Seong Gi Jeon, Asan-si (KR); Tae Gyu Kang, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/381,540

(22) Filed: Apr. 11, 2019

(65) Prior Publication Data
US 2020/0098637 A1 Mar. 26, 2020

(30) Foreign Application Priority Data
Sep. 20, 2018 (KR) ........................ 10-2018-0113223

(51) Int. Cl.
*H01L 21/78* (2006.01)
*H01L 21/822* (2006.01)
(Continued)

(52) U.S. Cl.
CPC ...... *H01L 21/7806* (2013.01); *H01L 21/0201* (2013.01); *H01L 21/0234* (2013.01);
(Continued)

(58) Field of Classification Search
CPC ..... H01L 21/78; H01L 21/782; H01L 21/784; H01L 2223/54453; H01L 21/7806;
(Continued)

(56) References Cited

U.S. PATENT DOCUMENTS

| 2003/0162368 A1* | 8/2003 | Connell ................ H01L 23/562 438/465 |
| 2004/0043616 A1 | 3/2004 | Harrison et al. |
| 2005/0085008 A1* | 4/2005 | Derderian ............... H01L 24/27 438/106 |

(Continued)

FOREIGN PATENT DOCUMENTS

| JP | 2018-026673 | 2/2018 |
| KR | 10-2003-0079560 | 10/2003 |

(Continued)

*Primary Examiner* — Ermias T Woldegeorgis
(74) *Attorney, Agent, or Firm* — F. Chau & Associates, LLC

(57) ABSTRACT

A method for fabricating a semiconductor device includes: providing a first wafer including a base substrate having a first surface and a second surface facing each other, and an element region disposed on the first surface of the base substrate, in which the first wafer includes a first semiconductor chip region and a second semiconductor chip region adjacent to each other, each including a portion of the base substrate and a portion of the element region; forming a cutting pattern in the base substrate between the first semiconductor chip region and the second semiconductor chip region; grinding a part of the base substrate to form a second wafer from the first wafer; forming a stress relief layer on the second surface of the ground base substrate; and expanding the second wafer to separate the first semiconductor chip region and the second semiconductor chip region from each other.

12 Claims, 17 Drawing Sheets

(51) Int. Cl.
  *H01L 23/00*   (2006.01)
  *H01L 21/02*   (2006.01)
  *H01L 21/304*  (2006.01)
  *H01L 21/52*   (2006.01)
  *H01L 21/56*   (2006.01)

(52) U.S. Cl.
  CPC ........ *H01L 21/0262* (2013.01); *H01L 21/304* (2013.01); *H01L 21/52* (2013.01); *H01L 21/56* (2013.01); *H01L 21/78* (2013.01); *H01L 21/822* (2013.01); *H01L 23/562* (2013.01)

(58) Field of Classification Search
  CPC . H01L 21/822; H01L 23/562; H01L 21/0201; H01L 21/304; H01L 2223/5446
  See application file for complete search history.

(56) References Cited

U.S. PATENT DOCUMENTS

| | | | |
|---|---|---|---|
| 2009/0057838 A1* | 3/2009 | Arita | H01L 21/31138 |
| | | | 257/618 |
| 2009/0311848 A1* | 12/2009 | Hoshino | H01L 27/14683 |
| | | | 438/463 |
| 2013/0069086 A1* | 3/2013 | Gunther | B28D 5/0011 |
| | | | 257/88 |

FOREIGN PATENT DOCUMENTS

| | | |
|---|---|---|
| KR | 10-2008-0077442 | 8/2008 |
| KR | 10-2011-0100883 | 9/2011 |
| KR | 10-1277999 | 6/2013 |

* cited by examiner

METHOD FOR FABRICATING A SEMICONDUCTOR DEVICE

CROSS-REFERENCE TO RELATED APPLICATION

This application claims priority under 35 U.S.C. § 119 to Korean Patent Application No. 10-2018-0113223, filed on Sep. 20, 2018, in the Korean Intellectual Property Office, the contents of which are incorporated by reference herein in their entirety.

TECHNICAL FIELD

The present disclosure relates to a method for fabricating a semiconductor device, and more particularly, to a method for fabricating a semiconductor package.

DISCUSSION OF RELATED ART

There has been a strong demand for semiconductor devices to have high density and high integration in response to the higher functionality in electronic devices and the expansion to mobile applications. As a result, large capacity and high density Integrated Circuit (IC) package is being developed.

In the methods for fabricating the semiconductor device, after grinding a wafer, a supporting film (e.g., Die Attach Film (DAF)) is bonded to a semiconductor wafer, and the wafer is cut into individual semiconductor elements by dicing.

A damaged film generated in the process of grinding the wafer may become a seed to cause a crack in the wafer. This may react with stress during an expanding process for dicing to cause damage to the IC pattern.

SUMMARY

Aspects of the present disclosure provide a method for fabricating a semiconductor device using a stress relief layer which suppresses stress occurring during an expanding process to a minimum.

Aspects of the present disclosure also provide a method for fabricating a semiconductor device capable of providing a high binding force between the stress relief layer and the supporting film through a plasma process.

According to an aspect of the present disclosure, there is provided a method for fabricating a semiconductor device, the method including: providing a first wafer including a base substrate having a first surface and a second surface facing each other, and an element region disposed on the first surface of the base substrate, in which the first wafer includes a first semiconductor chip region and a second semiconductor chip region adjacent to each other, each including a portion of the base substrate and a portion of the element region; forming a cutting pattern in the base substrate between the first semiconductor chip region and the second semiconductor chip region; grinding a part of the base substrate to form a second wafer from the first wafer after the forming of the cutting pattern; forming a stress relief layer on the second surface of the ground base substrate; and expanding the second wafer to separate the first semiconductor chip region and the second semiconductor chip region from each other.

According to an aspect of the present disclosure, there is provided a method for fabricating a semiconductor device, the method including: providing a first wafer including a base substrate, which has a first surface and a second surface facing each other, and an element region disposed on the first surface of the base substrate; grinding a part of the base substrate to form a second wafer from the first wafer; forming a stress relief layer on the second surface of the ground base substrate of the second wafer; performing a post-treatment to the stress relief layer, using a plasma process; forming a supporting film on the post-treated stress relief layer; and expanding the second wafer to dice the second wafer.

According to an aspect of the present disclosure, there is provided a method for fabricating a semiconductor device, the method including: providing a base substrate, which has a first surface and a second surface facing each other, in a first wafer which has an element region on the first surface of the base substrate, in which the first wafer includes a first semiconductor chip region and a second semiconductor chip region adjacent to each other, each including a portion of the base substrate and a portion of the element region; forming a first supporting film on the element region; forming a cutting pattern between the first semiconductor chip region and the second semiconductor chip region in the base substrate, using laser incident from the second surface of the base substrate; grinding a part of the base substrate to form a second wafer from the first wafer after the forming of the cutting pattern; forming a stress relief layer on the second surface of the ground base substrate; performing post-treatment to the stress relief layer, using a plasma process; forming a second supporting film on the post-treated stress relief layer; and expanding the second wafer to separate the first semiconductor chip region and the second semiconductor chip region from each other.

BRIEF DESCRIPTION OF THE DRAWINGS

The above and other aspects and features of the present disclosure will become more apparent by describing in detail exemplary embodiments thereof with reference to the accompanying drawings, in which.

Figure 1:
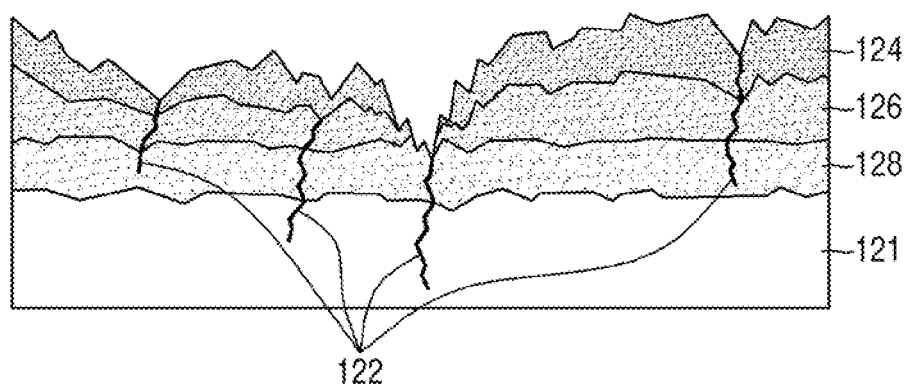
FIG. 1 is an exemplary cross-sectional view for explaining cracks that occur after grinding the wafer.

Since the drawings in FIGS. 1-15 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Thin wafers are continuously required due to the demand for lighter, thinner, shorter and compact semiconductor products. Various processes have been generated to meet such requirements. In a newly generated Grind After Laser (GAL) process, a cutting pattern may be formed inside the wafer by laser for the purpose of dividing a semiconductor chip region. After forming the cutting pattern on the wafer, grinding may be performed on the wafer. After the wafer grinding, expanding may be performed on the wafer to divide the semiconductor chip region along the cutting pattern on a supporting film (e.g., a Die Attach Film (DAF)) which bonds the wafer.

FIG. 1 is an exemplary cross-sectional view for explaining cracks that occur after grinding the wafer.

Referring to FIG. 1, damaged films may be generated on a wafer 100 due to stress occurring when grinding the wafer 100. The damaged films may become seeds to cause cracks 122 due to stress exerted on the wafer 100 during the grinding process. The cracks 122 may penetrate from an amorphous silicon 124 to a plastic silicon 126, from the amorphous silicon 124 to an elastic silicon 128, or from the amorphous silicon 124 to a crystalline silicon 121 with an Integrated Circuit (IC) pattern formed thereon. The elastic silicon 128, the plastic silicon 126 and the amorphous silicon 124 are sequentially arranged on the crystalline silicon 121.

Figure 2A:
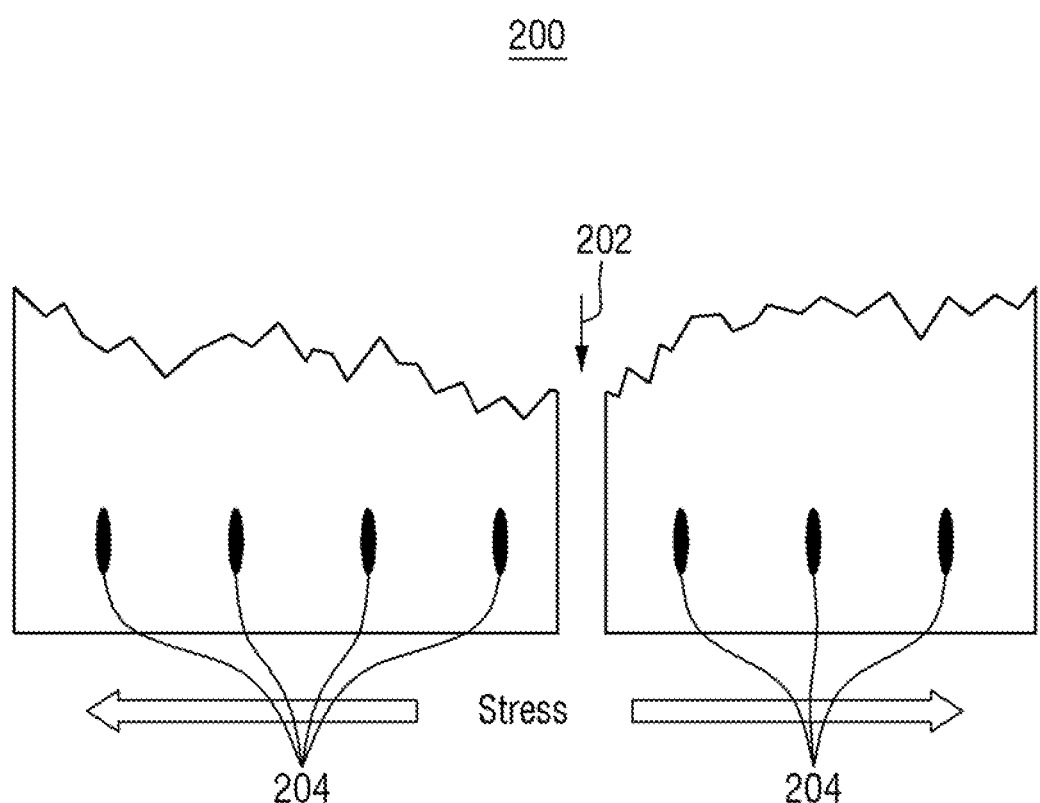
FIG. 2A is an exemplary cross-sectional view in which portions with cracks exert damages to the IC pattern by stress due to expanding.

FIG. 2A is an exemplary cross-sectional view in which portions with cracks exert damages to the IC pattern by stress due to expanding.

Referring to FIG. 2A, an expanding process may be used to cut a semiconductor chip region and a supporting film (e.g., DAF) after grinding. Stress such as tensile stress due to the expanding process may be exerted on the wafer 200. The microcrack in the damaged film on the wafer 200 at the portion in which the crack 202 occurs may grow due to the exerted stress, and the size may increase with the time that the tensile stress is exerted on the wafer 200.

The grown crack 202 may also affect the IC pattern portion of the wafer 200. Further, the semiconductor chip region is not separated along the cutting pattern 204 formed intended to separate the semiconductor chip region, and the portion in which the crack 202 occurs may be separated by stress. For example, the semiconductor chip region may be separated by the crack 202, but not separated by the cutting pattern 204. This may result in incorrect separation of the miniaturized semiconductor chip region.

Figure 2B:
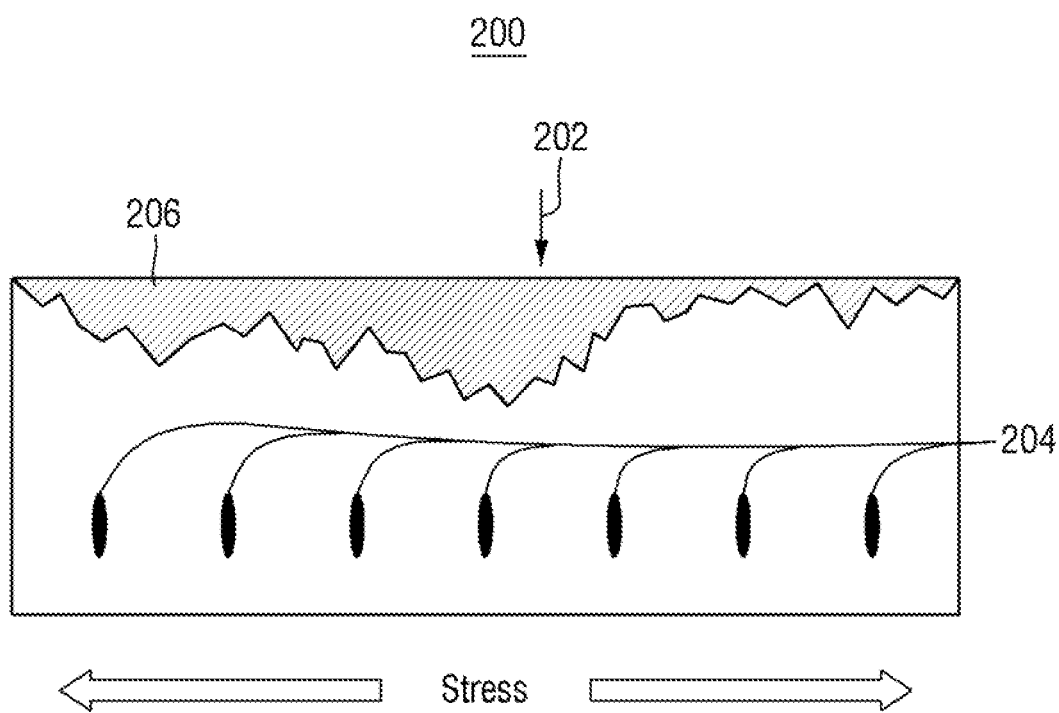
FIG. 2B is an illustrative diagram for explaining relieving stress due to expanding through a stress relief layer.

FIG. 2B is an illustrative diagram for explaining relieving stress due to expanding through a stress relief layer.

Referring to FIG. 2B, a stress relief layer 206 may be deposited on the wafer 200. The stress relief layer 206 may be deposited on the wafer through a chemical vapor deposition process such as, for example, Plasma Enhanced Chemical Vapor Deposition (PECVD) process. However, the present disclosure is not limited thereto. For example, as the method for forming the stress relief layer 206, besides PECVD, deposition of the stress relief layer 206 may also be performed by other methods capable of molecular bonding between silicon of the wafer 200 and the stress relief layer 206.

Unlike FIG. 2A, the stress-relief layer 206 may reduce transmission of stress such as tensile stress in the expanding process to the wafer 200. The stress relief layer 206 includes a material capable of molecularly binding with the wafer 200 (e.g., a silicon atom of the wafer 200), and may be a polymer, but the present disclosure is not limited thereto.

The stress transmitted to the wafer 200 is reduced at the portion in which the crack 202 occurs by the stress relief layer 206, which may prevent the crack 202 from growing up to the IC pattern. Therefore, when the wafer 200 is expanded and each semiconductor chip region is separated, the semiconductor chip region may be separated along the portion in which the cutting pattern 204 is formed. For example, the tensile stress may be applied to the cutting pattern 204 to develop an internal crack along the cutting pattern 204 towards both surfaces of the wafer 200 and to separate the wafer 200.

Hereinafter, a method for fabricating a semiconductor device using a stress relief layer will be described.

Figure 3:
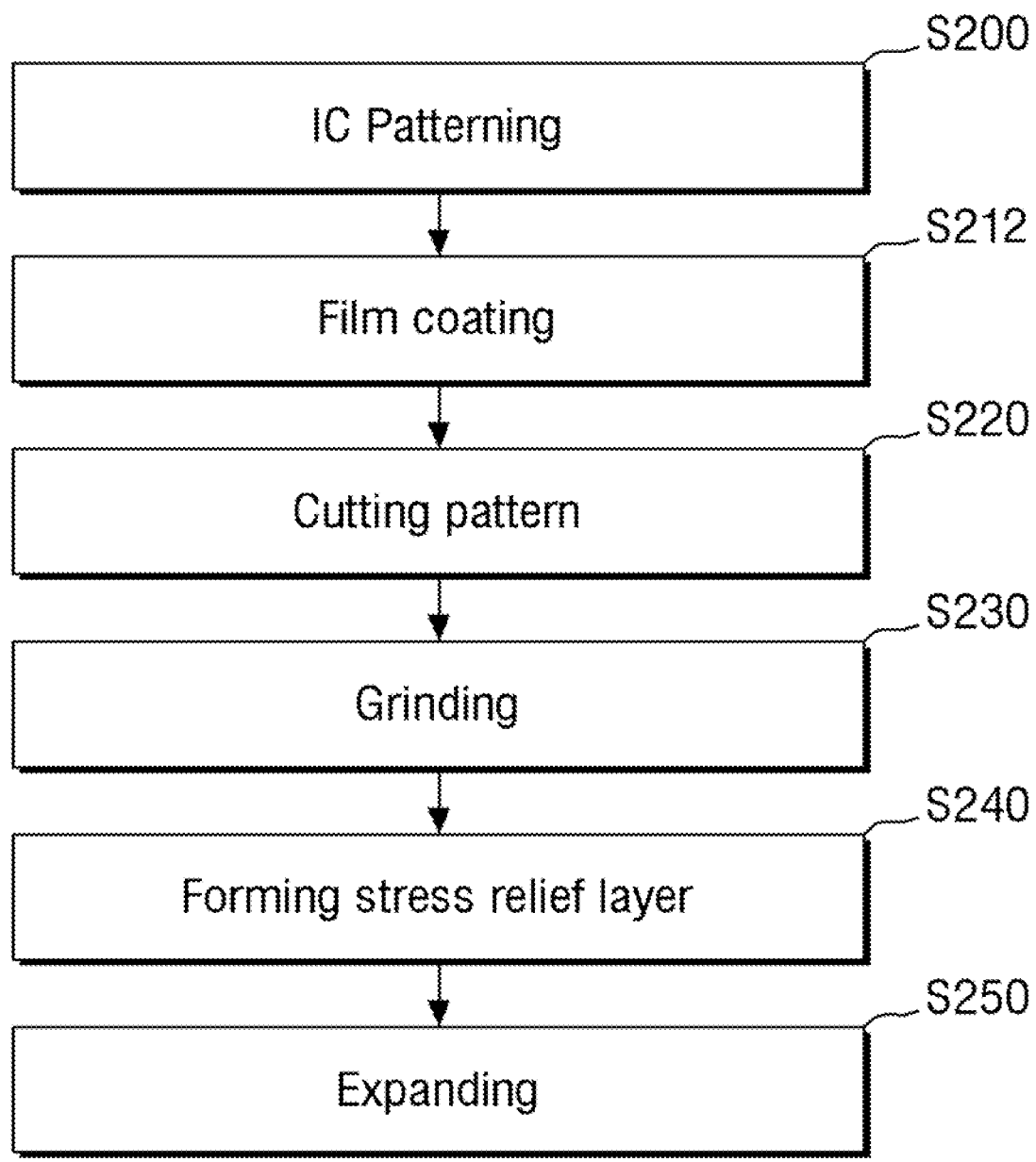
FIG. 3 is a flowchart illustrating a method for fabricating the semiconductor device according to an exemplary embodiment of the present disclosure.
Figure 4:
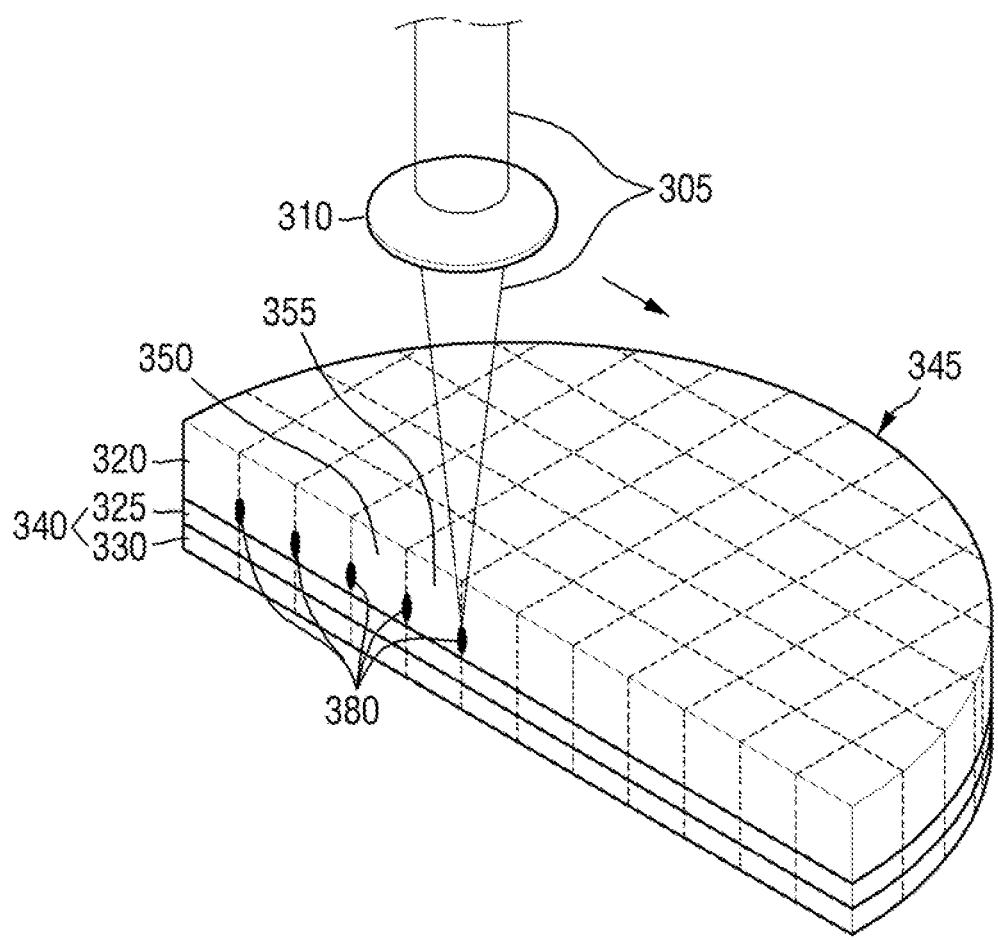
FIG. 4 is a perspective view for explaining a method for forming a cutting pattern on a wafer using a laser.
Figure 5A:
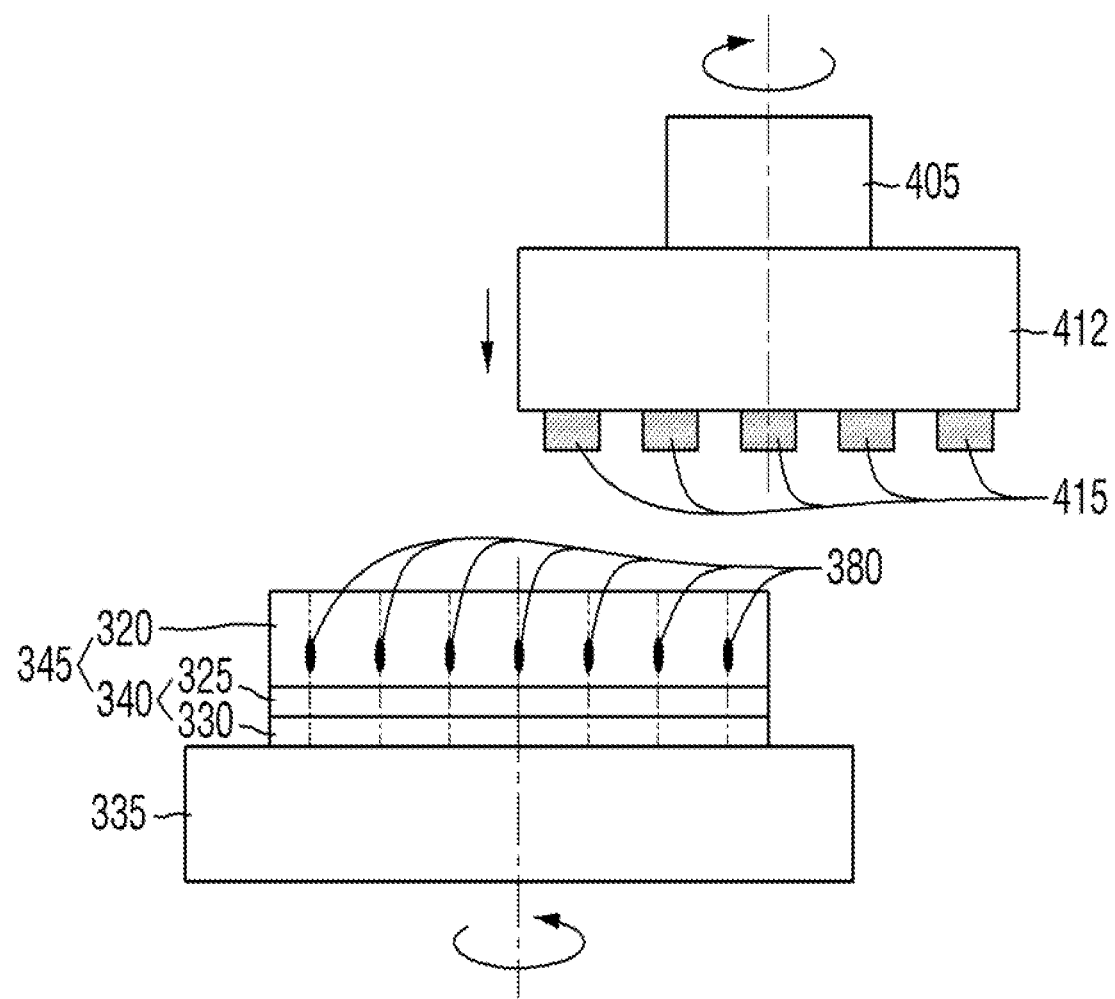
FIG. 5A is an exemplary diagram illustrating a process of grinding a base substrate of the wafer.
Figure 5B:
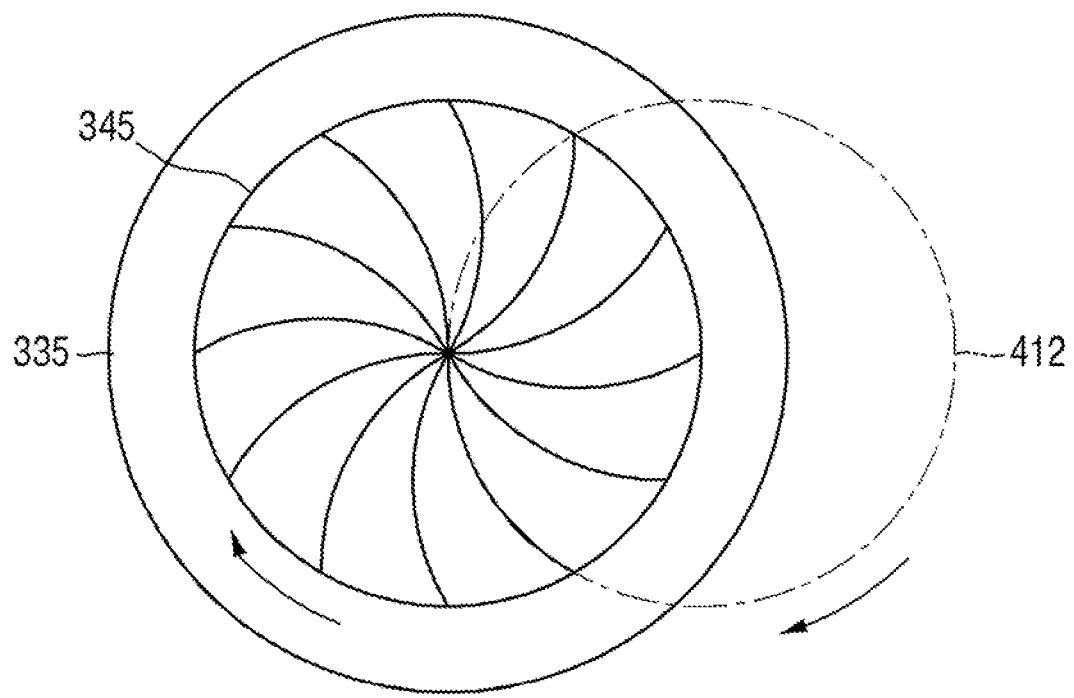
FIG. 5B is a view of the grinding process of FIG. 5A as seen from the top.
Figure 6:
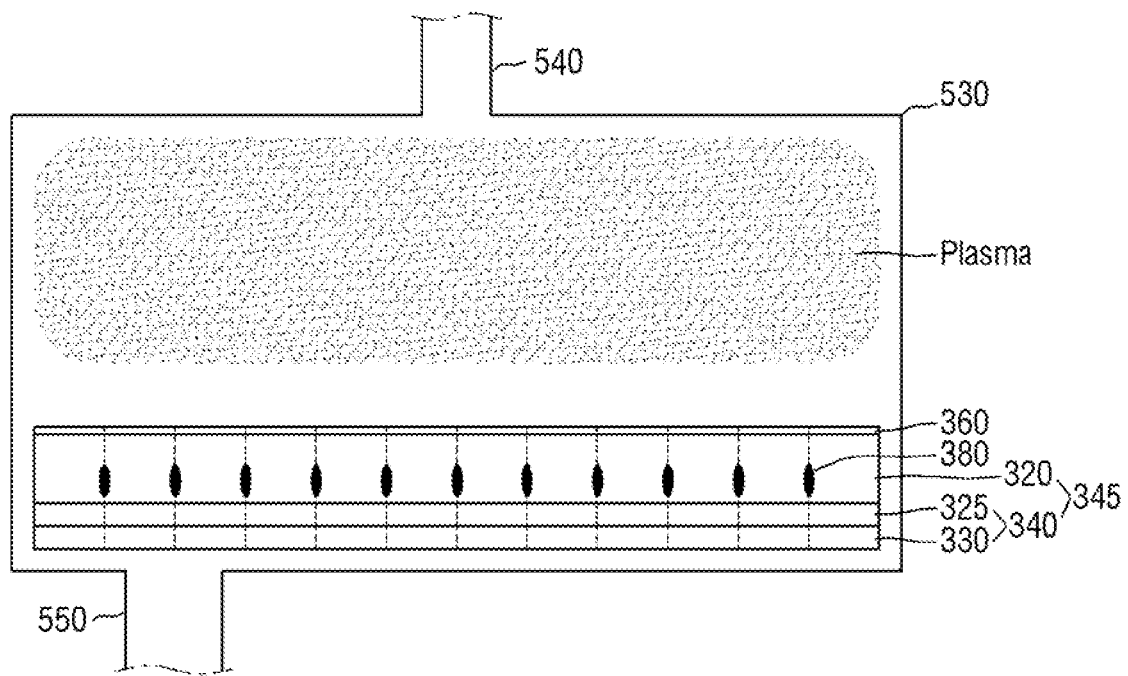
FIG. 6 is an exemplary diagram for explaining a process of depositing the stress relief layer on the base substrate of the wafer via Plasma Enhanced Chemical Vapor Deposition (PECVD)
Figure 7:
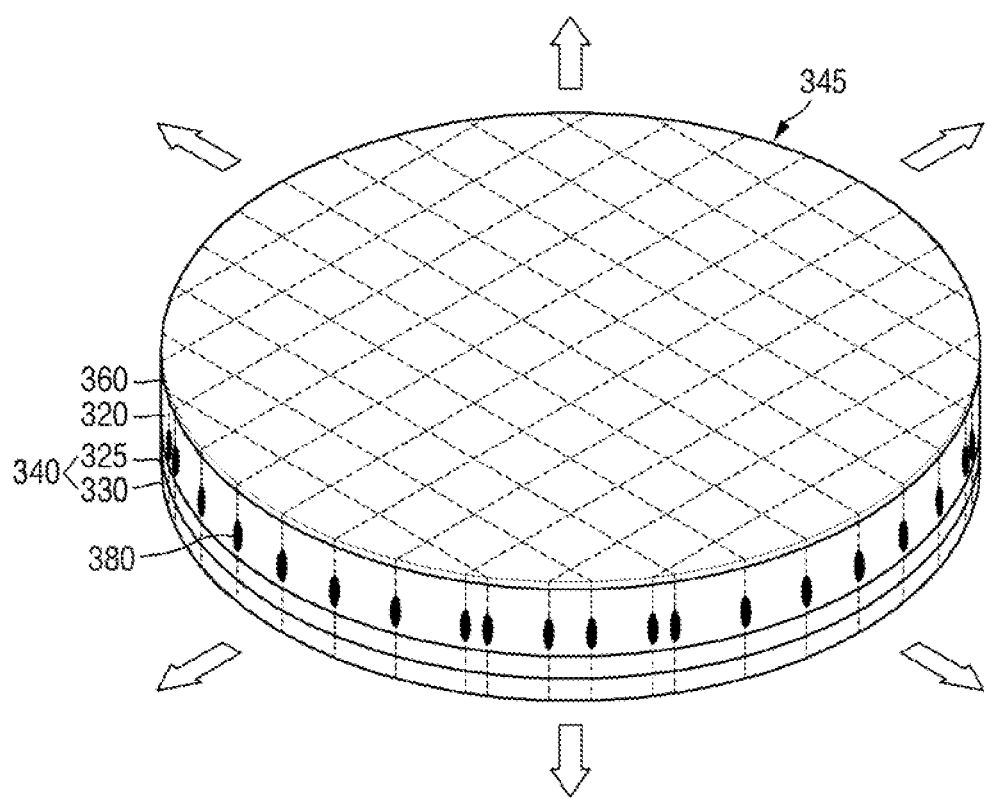
FIG. 7 is an exemplary view illustrating separation of a semiconductor chip region through an expanding process.

FIG. 3 is a flowchart illustrating a method for fabricating the semiconductor device according to an exemplary embodiment of the present disclosure. FIG. 4 is a perspective view for explaining a method for forming a cutting pattern on a wafer using a laser. FIG. 5A is an exemplary diagram illustrating a process of grinding a base substrate of the wafer. FIG. 5B is a view of the grinding process of FIG. 5A as seen from the top. FIG. 6 is an exemplary diagram for explaining a process of depositing the stress relief layer on the base substrate of the wafer via PECVD. FIG. 7 is an exemplary view illustrating separation of a semiconductor chip region through an expanding process.

Referring to FIG. 3, IC patterning is performed on a first surface of the wafer (S200). The IC pattern formed through IC patterning (S200) may be a Front-End-Of-Line (FEOL), and may include, but is not limited to, individual elements such as, for example, transistors, capacitors and resistors of a semiconductor element.

Film coating is executed on the wafer on which the IC patterning (S200) is performed (S212).

The film coating (S212) may be executed to protect the IC pattern prior to performing a grinding process to be described below. An adhesive film to adhere to the wafer at the time of laminating the adhesive film onto the wafer before the dicing process may have excellent adhesion without air bubbles. Further, peeling or water immersion should not occur between the adhesive film and a back side of the wafer or the supporting film, due to process water used in the dicing process, and water and air used for cleaning. In addition, the separated chips should be easily picked up in the process of picking up the chips separated in the dicing process.

In the case of products requiring high processing speed and high memory density, the adhesive strength of the film should be high in the method for fabricating the semiconductor device. An adhesive composition may be included in the film coating layer. The film should have excellent attaching force and sticking force to the wafer at the time of lamination. The film may have, but is not limited to, a plurality of layer configurations, such as, for example, a first adhesive composition layer and a second adhesive composition layer, a base material layer and an adhesive composition layer, an adhesive composition layer and a base material layer, or a base material layer, an adhesive composition layer, and a sticking layer. Besides the two layer and three layer configurations described above for the film, four and more layer configurations may also be used. For example, in an exemplary embodiment of the present disclosure, a four-layer laminated film may include a first base material layer, a first adhesive composition layer, a second adhesive composition layer and a second base material layer.

The adhesive composition may contain, but is not limited to, a solvent such as a component (for example, acetone, methyl ethyl ketone, n-butyl acetate, heptane, toluene, ethyl acetate, etc.) usually used in the adhesive composition for semiconductor process.

Materials commonly usable as the base material film of adhesive films for semiconductor fabrication, such as, for example, polyethylene terephthalate, polyolefin-based or polyvinyl chloride-based materials, may be used for the base material layer, but the present disclosure is not limited thereto.

As the sticking layer, a sticking material which is usually used for an adhesive film for fabricating semiconductor, such as an acrylic material containing a photoreactive oligomer may be used, but the present disclosure is not limited thereto.

A cutting pattern for separating the semiconductor chip region subjected to film-coating (S212) is formed (S220).

As a method for separating the semiconductor chip region, a mechanical cutting method may be used. A circular blade made of a material with high hardness such as diamond may be rotated at high speed to cut the semiconductor wafer. As such a mechanical cutting method, a method of fixing the wafer with an adhesive dicing tape, and then cutting the wafer with a blade along a scribe lane is used. Therefore, the mechanical cutting method may not be performed in a batch process in which wafers are simultaneously cut. Also, in the mechanical cutting method, a plurality of cutting processes need to be partially performed. Therefore, the mechanical cutting method requires a lot of time. In addition, in the cutting process using the blade, problems due to mechanical damage and frictional heat generated in the semiconductor wafer may occur. For example, the blade tends to cause chipping of the front and back sides of the wafer. Debris generation is also one of the major concerns using the mechanical cutting method. Further, there is a disadvantage that the process cost is high due to replacement of the blade having a limited lifetime.

To maintain the strength and fix the blade to the equipment, the blade may have a certain thickness or more. Therefore, it is difficult to execute a fine dicing process by the mechanical cutting method. Furthermore, it is difficult to apply the mechanical cutting method to a small packaging process with a size of several tens of microns (µm) or less due to an interval between the cut portion for protecting the element from mechanical and thermal damage generated around the cut portion.

In recent years, with the development of the techniques of semiconductor elements, the semiconductor chip region has been miniaturized. In addition to the conventional memory device structures, various fields such as flexible elements and elements using carbon-based materials occur. However, it is difficult to apply the mechanical cutting method to a miniaturized semiconductor chip region and various fields. Therefore, a stealth cutting method for forming a cutting pattern using a laser may be used, as a kind of a new dicing method capable of performing a fine process while maintaining process reliability, enhancing process yield, and enhancing economy.

The laser-based cutting method may be roughly divided into two methods. A first method is a method for cutting a specimen by removing a part of the specimen through a phase change such as, for example, liquefaction, vaporization or plasma formation, using a laser having a wavelength corresponding to an absorption band of the specimen to be cut. Thus, the laser beam may be absorbed by the specimen. Also, the laser beam may be focused on the surface of the wafer. In the first method, there is a limit in the amount of specimen that may be removed using one laser irradiation. Therefore, cutting may be performed in such a manner that the specimen material is removed in a depth direction through several times of scanning. As a result, wafer processing may take a lot of time. In addition, a wide heat affected zone (HAZ) may be formed in a peripheral region of wafer processing. Also, during the laser process, molten particles (e.g., silicon dust or other type of semiconductor dust) from the removed specimen may spread on the surface of the wafer. The first method has limits such as, for example, changing the physical property of the wafer, leaving the residual stress in the wafer to weaken the strength or lowering the uniformity of the specimen.

A second method is to indirectly support cutting by generating a cutting pattern on the wafer rather than a physical removal of the specimen material.

Referring to FIG. 4, a condensing lens 310 is irradiated with a laser 305. The portion of the wafer 345 to be cut may be accurately irradiated with the laser 305 through the condensing lens 310, thereby forming cutting patterns 380. The laser 305 includes, but is not limited to, nano ($10^{-9}$) second pulse laser or pica ($10^{-12}$) second pulse laser.

At least several picoseconds of time may be taken to convert the energy of the laser into thermal energy within the wafer 345. A pulse duration of the nanosecond or picosecond pulsed laser may be converted into the form of thermal energy within the wafer 345 after it takes a few picoseconds or more.

The cutting patterns 380 may each be formed along a movement line of the laser 305. A first semiconductor chip region 350 and a second semiconductor chip region 355 may be distinguished through the cutting pattern 380. The first semiconductor chip region 350 and the second semiconductor chip region 355 may include a base substrate 320 on which the cutting pattern 380 is formed, and an element region 340 (the element region 340 may include an IC pattern 325 and a film 330). For example, the first semiconductor chip region 350 and the second semiconductor chip region 355 may be adjacent to each other, and each may include a portion of the base substrate 320 and a portion of the element region 340. The cutting pattern 380 may be formed in the base substrate 320 at an internal point between the first semiconductor chip region 350 and the second semiconductor chip region 355.

The cutting pattern 380 may be formed in the base substrate 320 inside the wafer 345 through the laser 305. The laser 305 may be incident on the wafer 345 from the base substrate 320 side (e.g., back side of the wafer 345) as shown in FIG. 4. For example, the laser 305 may irradiate an internal point in the base substrate 320 to form the cutting pattern 380, and thus, the position of the cutting pattern 380 may be determined by the focus depth of the laser 305. Therefore, it is possible to suppress dust generated when physically cutting the surface of the wafer 345. Further, by forming the cutting pattern 380 in the base substrate 320 via the laser 305, cleaning of the wafer 345 is not required.

Referring again to FIG. 3, a part of the base substrate of the wafer having the cutting pattern formed thereon (S220) is ground (S230). Grinding (S230) may be executed to control thickness and flatness of the wafer.

The grinding (S230) is a process added to satisfy the high flatness that is required as the semiconductor device becomes highly integrated. In addition, the grinding (S230) may be used to thin the wafer 345 to achieve a desired minimum wafer thickness. The flatness of the wafer 345 may be defined by a total thickness variation (TTV) representing a difference between a maximum value and a minimum value of the thickness of the wafer 345, and a site backside ideal range (SBT) which is a local thickness variation (LTV) representing a difference in the local thickness. As the line width of the semiconductor device is miniaturized, it is difficult to satisfy the requirements of TTV and SBT only with the conventional lapping process and polishing process. Therefore, since it is difficult to develop a high-quality wafer, a grinding (S230) process which may satisfy the flatness of the wafer 345 may be additionally performed.

Referring to FIG. 5A, the grinding device used in step S230 includes a chuck table 335 to which a wafer 345 is adsorbed, a grinding wheel 412 having a grinding tooth 415 attached thereto, and a grinding spindle 405 for rotating the grinding wheel 412.

When the wafer 345 is loaded on the chuck table 335, the chuck table 335 may adsorb the loaded wafer 345 by vacuum. Besides vacuum, the chuck table 335 may also adsorb the loaded wafer 345 by electrostatic, mechanical or magnetic force as long as the chuck table 335 provides claiming uniformity and does not cause distortion or damage to the loaded wafer 345. The chuck table 335 may rotate the adsorbed wafer 345 at a constant speed. Further, the grinding tooth 415 may be lowered while rotating, onto the top of the chuck table 335. The grinding tooth 415 may be attached to the grinding wheel 412, and may be spaced apart from each other at a predetermined interval. The grinding tooth 415 may come into contact with the wafer 345, and the grinding (S230) of the base substrate 320 of the wafer 345 is started.

The material of the grinding tooth 415 may be diamond, but the present disclosure is not limited thereto. The grinding tooth 415 may be bonded to the grinding wheel 412 with an adhesive at regular intervals. The grinding tooth 415 may be formed to protrude from the grinding wheel 412. The grinding spindle 405 may rotate at high speed. Therefore, the grinding tooth 415 may rotate on the surface of the base substrate 320 of the wafer 345. Finally, the grinding tooth 415 may grind the base substrate 320 of the wafer 345 on the chuck table 335.

Referring to FIGS. 4 to 5B, the grinding device used in step S230 may be seen from the top. The grinding wheel 412 may be lowered while rotating in a clockwise direction, to the wafer 345 on the chuck table 335 rotating at high speed in a clockwise direction. As shown in FIG. 5B, the wafer 345 may be fixed on the chuck table 335 in such a way that its center substantially corresponds to the rotation center of the chuck table 335. Moreover, grinding wheel 412 may be positioned in such a way that the rotation center of the wafer 345 reaches the edge region formed by the grinding tooth 415 of the grinding wheel 412. As a result, the entire surface of the wafer 345 may be ground. Therefore, the grinding tooth 415 of the grinding wheel 412 may grind the base substrate 320 of the wafer 345 to a specified thickness. The rotational direction of the wafer 345 and the grinding wheel 412 on the chuck table 335 is not limited thereto.

As a result, cracks may be left on the back side of the wafer 345 in the step S230. Other surface or subsurface damages may be expected for typical mechanical processing such as the grinding process described here. The cracks may act as a critical cause of the fracture due to the difference in coefficient of thermal expansion between an Epoxy Molding Compound (EMC) or a Printed Circuit Board (PCB) and a semiconductor chip region (e.g., a first semiconductor chip region 350 and a second semiconductor chip region 355). Further, the wafer 345 is resistant to a compressive stress but may be vulnerable to a tensile stress. If a tensile stress due to expanding occurs on the back side of the wafer 345 having a crack due to the step S230, the breaking strength of the wafer 345 may be markedly lowered. For example, incorrect separation of the miniaturized semiconductor chip region (e.g., a first semiconductor chip region 350 and a second semiconductor chip region 355) may occur.

The cracks occurring in the wafer 345 may be formed in a spiral pattern from the center of the wafer 345. At this time, when performing the expanding to dice the wafer 345 into individual semiconductor chip regions (e.g., the first semiconductor chip region 350 and the second semiconductor chip region 355), the degree of stress concentration may be greatly varied, depending on the crack direction that exists in the wafer 345.

To reduce the influence on the wafer 345 by cracks occurring through the step S230, there is a need for a process (S240) of forming a stress relief layer to be described later.

Referring again to FIG. 3, after step S230, a stress relief layer may be formed on the wafer (S240). The stress relief layer may be deposited with a PECVD process on the wafer 345, but the present disclosure is not limited thereto. For example, any deposition process can be used as long as the stress relief layer 360 can be deposited on the wafer 345 through molecular bonding.

Referring to FIG. 6, the device for performing step S240 includes a plasma chamber 530, a gas injection port 540, and a gas discharge port 550. A gas of the stress relief layer 360 to be deposited may be injected into the plasma chamber 530 through the gas injection port 540. A high voltage may be applied into the plasma chamber 530 to change the gas of the stress relief layer 360 into a plasma state. The gas ionized to the plasma state may chemically react with each other and then may form molecular bonding with silicon of the base substrate 320. The gas ionized into the plasma state may form a stable and continuous network structure on one side of the base substrate 320 of the wafer 345. In addition, the stable and continuous network structure may be evenly accumulated on one side of the base substrate 320 of the wafer 345 to form the stress relief layer 360. The remaining ions may be discharged through the gas discharge port 550.

In PECVD, energy necessary for dissociating a source gas may be obtained from a voltage rather than thermal energy. Therefore, vapor deposition may be performed at a low temperature with low cost at a wide area. Through the vapor deposition at a low temperature, the drawback of melting of an aluminum conducting wire or a glass substrate on the wafer 345 at the time of the high temperature process may be supplemented. Therefore, it may be used in a display device and a solar cell fabricating process. Also, the vapor deposition rate of PECVD is relatively high in comparison to other processes.

The bonding between the silicon of the wafer 345 is broken due to the grinding (S230), and a dangling bond may be formed. When the vapor deposition temperature of the silicon relief layer 360 reaches 400° C. or higher, hydrogen atoms may react with each other and exit in the form of $H_2$. Therefore, for the stress relief layer 360 to be molecularly bonded to the dangling bond, a low vapor deposition temperature is required. The stress relief layer 360 may be molecularly bonded to the dangling bond of the wafer 345 through the step S240 (e.g., using the PECVD process) at which the vapor deposition can be performed at a low temperature. Therefore, it is possible to have a strong binding force through molecular bonding between the stress relief layer 360 and the dangling bond of the wafer 345.

Referring again to FIG. 3, from the wafer having the stress relief layer formed thereon (S240), the semiconductor chip region of the wafer may be separated through the expanding process (S250).

Referring to FIG. 7, by expanding the wafer 345 divided on the basis of the cutting pattern 380 using stretching force, the wafer 345 may be expanded by applying uniform force so that the semiconductor chip regions on the wafer 345 are exactly separated.

Figure 8:
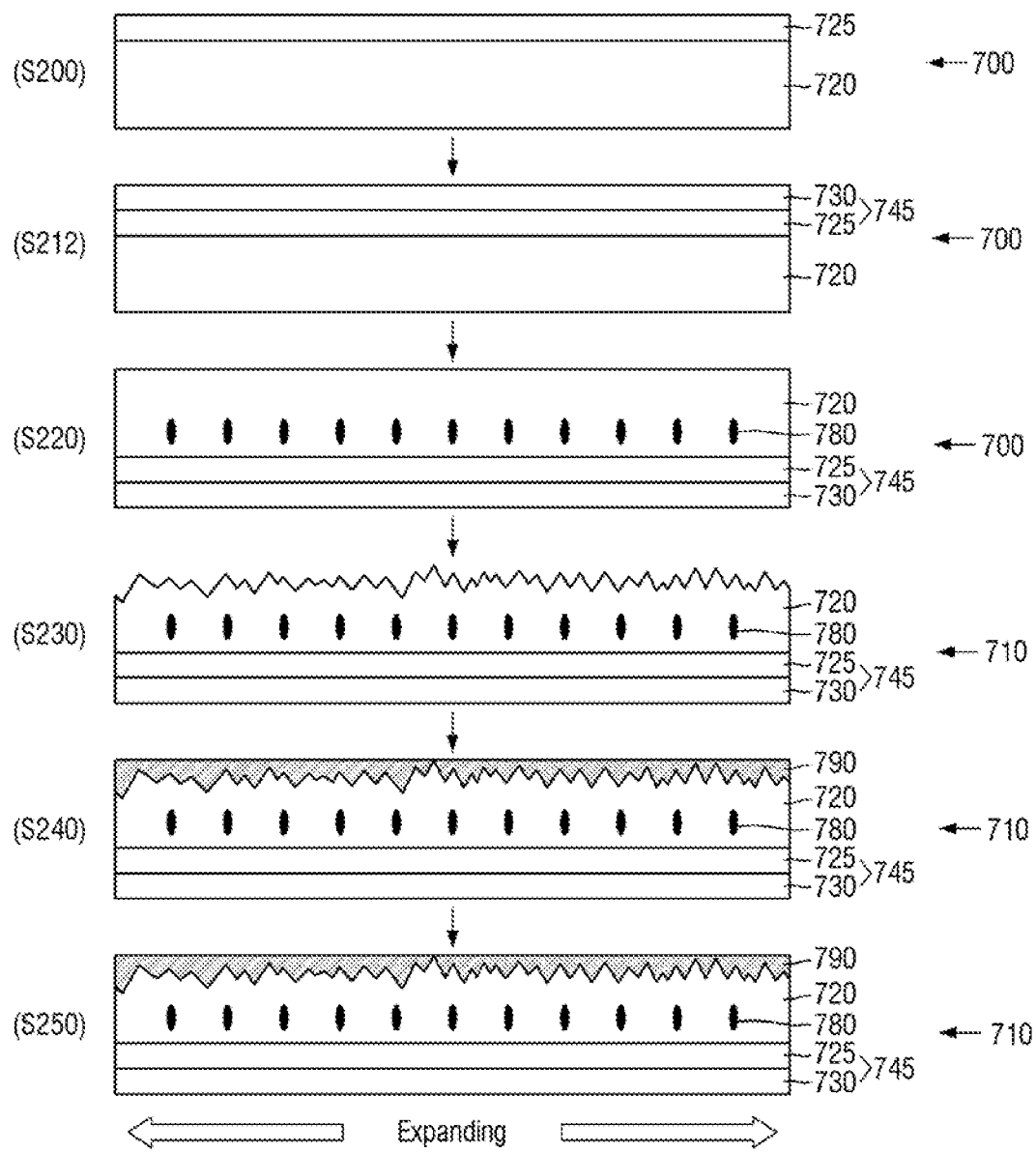
FIG. 8 is a flowchart illustrating a cross section of the wafer in the process of FIG. 3.

FIG. 8 is a flowchart illustrating a cross section of the wafer in the process of FIG. 3.

Referring to FIGS. 3 and 8, in step S200, IC patterning is performed on the first wafer 700 to form IC pattern 725 before being ground.

In step S212, the film 730 may be formed on the IC pattern 725 of the first wafer 700. The IC pattern 725 and the film 730 may be included in the element region 745. The film 730 may protect the IC pattern 725 when grinding the base substrate 720 of the first wafer 700. For example, the film 730 should have excellent attaching three and sticking three to the first wafer 700.

In step S220, a cutting pattern 780 may be formed in the base substrate 720 of the first wafer 700. The cutting pattern 780 may be formed through the laser described in FIG. 4, but the present disclosure is not limited thereto.

In an exemplary embodiment of the present disclosure, the cutting pattern 780 may be formed by an etch process instead of through the laser described above. For example, a trench is formed as the cutting pattern 780, and a liquid is applied onto the surface of the wafer on which the trench is formed, and the liquid may be injected into the trench. After the liquid is injected into the trench, the wafer may be cooled. The volume of the liquid injected into the trench is expanded by cooling and the wafer may be separated.

The method may further include a surface treatment step for enhancing the wettability inside the trench when applying the liquid, and the surface treatment step may be performed through a plasma surface treatment process. An anisotropic etching process may be used for forming the trench. The liquid application may be performed by a spray application method or a spin coating method, and the liquid may be water, but the present disclosure is not limited thereto.

A fine dicing process can be performed, while maintaining the reliability of the process, by separating the semiconductor chip region, using the expansion force generated when the liquid is cooled. Further, since the entire semiconductor wafer may be cut at the same time without being partially cut, and the dicing process may be constituted by a batch process, the process yield of the dicing process may be enhanced.

In step S230, a part of the base substrate 720 of the first wafer 700 is ground to form a second wafer 710.

Referring again to FIG. 5A, a part of the base substrate 720 of the first wafer 700 may be ground, while rotating the grinding wheel 412 to which the grinding tooth 415 is attached. In addition to the occurrence of cracks 122 as explained in FIG. 1 due to grinding, since a high heat due to rotation occurs on the grinding wheel 412 and the first wafer 700 accumulates, a problem such as burning of the first wafer 700 may occur.

A grinding workpiece generated at the time of grinding may adhere to the fine holes existing on the processing surface of the polishing tooth 415. A clogging phenomenon that lowers polishing force of the grinding tooth 415 by the workpiece may occur. As a result, the polishing time for polishing the thickness of the first wafer 700 to a target thickness may increase. This may lower the production yield of the wafer. In addition, this may deteriorate the flatness of the wafer and the nano quality.

In step S240, the stress relief layer 790 may be formed on the base substrate 720 of the second wafer 710 after grinding. The stress exerted on the damaged second wafer 710 may be relieved via the stress relief layer 790.

For the second wafer 710 having a thickness of about 10 μm or more and about 60 μm or less according to the size of the miniaturized semiconductor chip, damage to the second wafer 710 from the stress caused by expanding can be prevented through the stress relief layer 790 having a thickness of about 10 nm or more and about 500 nm or less. In the excessively thick stress relief layer 790, the vacancy space between the molecules increases and the bonding strength may be further weakened.

In step S250, dicing may be performed to separate the semiconductor chip region along the cutting pattern 780 through the expanding process. In this course, cracks may be formed in the second wafer 710 formed by grinding (S230) as described in FIG. 2A. However, the effect of stress suffered by expanding may be reduced by the stress relief layer 790. Therefore, accurate dicing may be performed along the cutting pattern 780 to divide the miniaturized semiconductor chip regions.

In an exemplary embodiment of the present disclosure, the cutting pattern 780 formed by laser may be a hair-crack within the base substrate 720. The hair-crack of the cutting pattern 780 may enable the semiconductor chip regions to cleave cleanly as underlying dicing tape or film is stretched to separate the semiconductor chip regions from one another during the expanding step S250. The dicing film or tape is connected to the second wafer 710 and is expandable so that individually separated semiconductor chip regions can be picked up.

Figure 9:
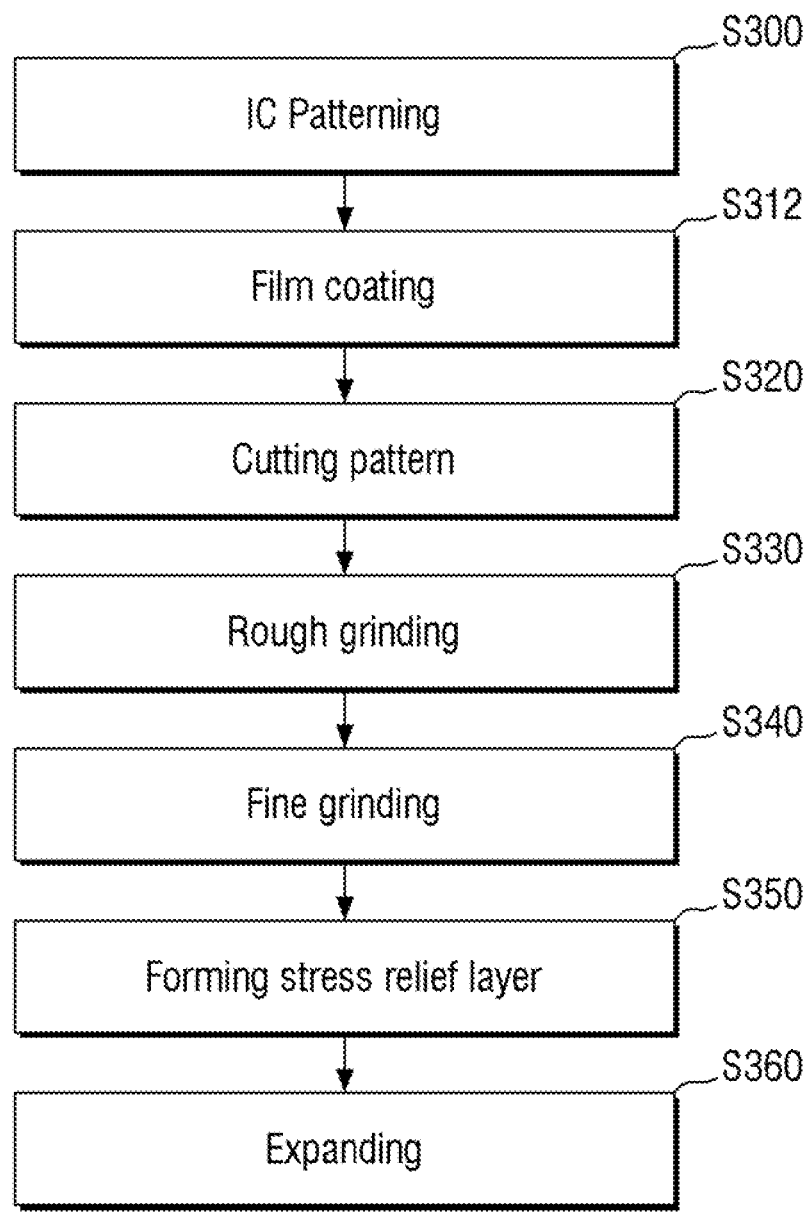
FIG. 9 is a flowchart illustrating a method for fabricating a semiconductor device according to an exemplary embodiment of the present disclosure.

FIG. 9 is a flowchart illustrating a method for fabricating a semiconductor device according to an exemplary embodiment of the present disclosure.

Referring to FIG. 9, IC patterning is executed on the first surface of the wafer (S300).

After step S300, a film coating is executed on the wafer (S312). Since the specific explanation is the same as step S212 of FIG. 3, the description thereof will not be provided.

After step S312, a cutting pattern for separating the semiconductor chip region is formed (S320). Since the specific explanation is the same as step S220 of FIG. 3, the description thereof will not be provided.

After step S320, a rough grinding (S330) and a fine grinding (S340) are executed.

Referring to FIG. 5A, a considerable amount of the base substrate 320 of the semiconductor wafer 345 may be ground, using the grinding wheel 412 (S330). Thereafter, a double grinding process of grinding the degree of fine scratches (S340) may be performed. For example, with the fine grinding at step S340 may reduce the coarse scratches on the semiconductor wafer 345 to finer ones. A more refined thickness may be ground through the double grinding process as compared to the one grinding process corresponding to the step S230 of FIG. 3.

After step S340, a stress relief layer is formed (S350). Since the specific explanation is the same as the step S240 of FIG. 3, the description thereof will not be provided.

After step S350, an expanding process is executed (S360). Since the specific explanation is the same as step S250 of FIG. 3, the description thereof will not be provided.

Figure 10:
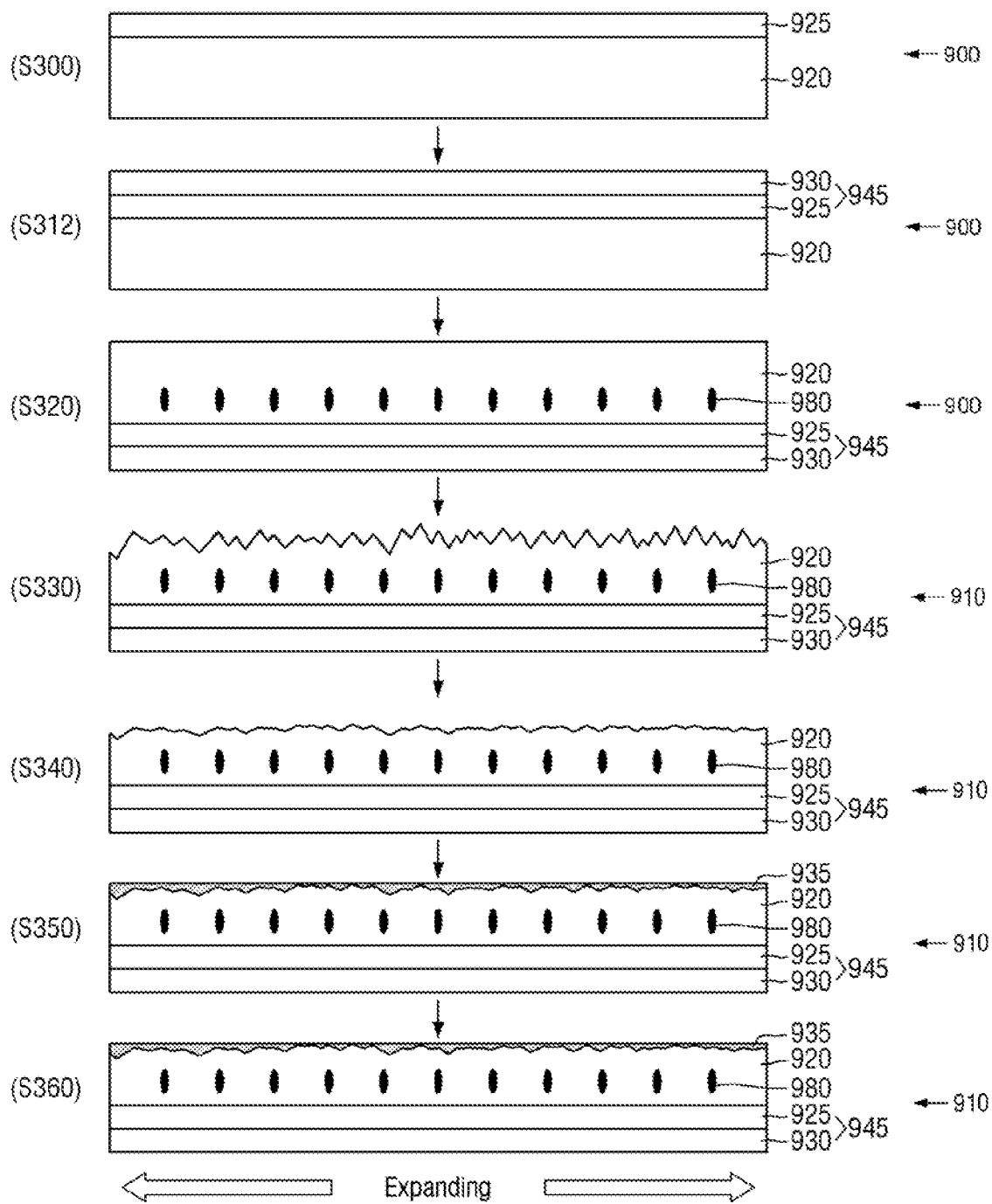
FIG. 10 is a flowchart illustrating a cross section of the wafer according to the process of FIG. 9.

FIG. 10 is a flowchart illustrating a cross section of the wafer according to the process of FIG. 9.

Referring to FIGS. 9 and 10, since the steps S300 to S320 and the steps S350 to S360 of FIG. 10 are the same as the steps S200 to S250 of FIG. 8, the explanation will not be provided.

A second wafer 910 may be produced by executing a rough grinding (S330) and a fine grinding (S340) on the first wafer 900. The first wafer 900 may include an element region 945 (which may include an IC pattern 925 and a film 930), and a cutting pattern 980. A substantial amount of the base substrate 920 of the first wafer 900, may be ground using the grinding wheel 412 of FIG. 5A (S330). Thereafter, the double grinding process of grinding the degree of fine scratches (S340) enables grinding to a more refined thickness as compared with the one grinding process according to step S230 of FIG. 3. The second wafer 910 may include a stress relief layer 935. Thus, the effect of stress suffered by expanding may be reduced by the stress relief layer 935, and accurate dicing may be performed along the cutting pattern 980 to divide the miniaturized semiconductor chip regions.

Figure 11:
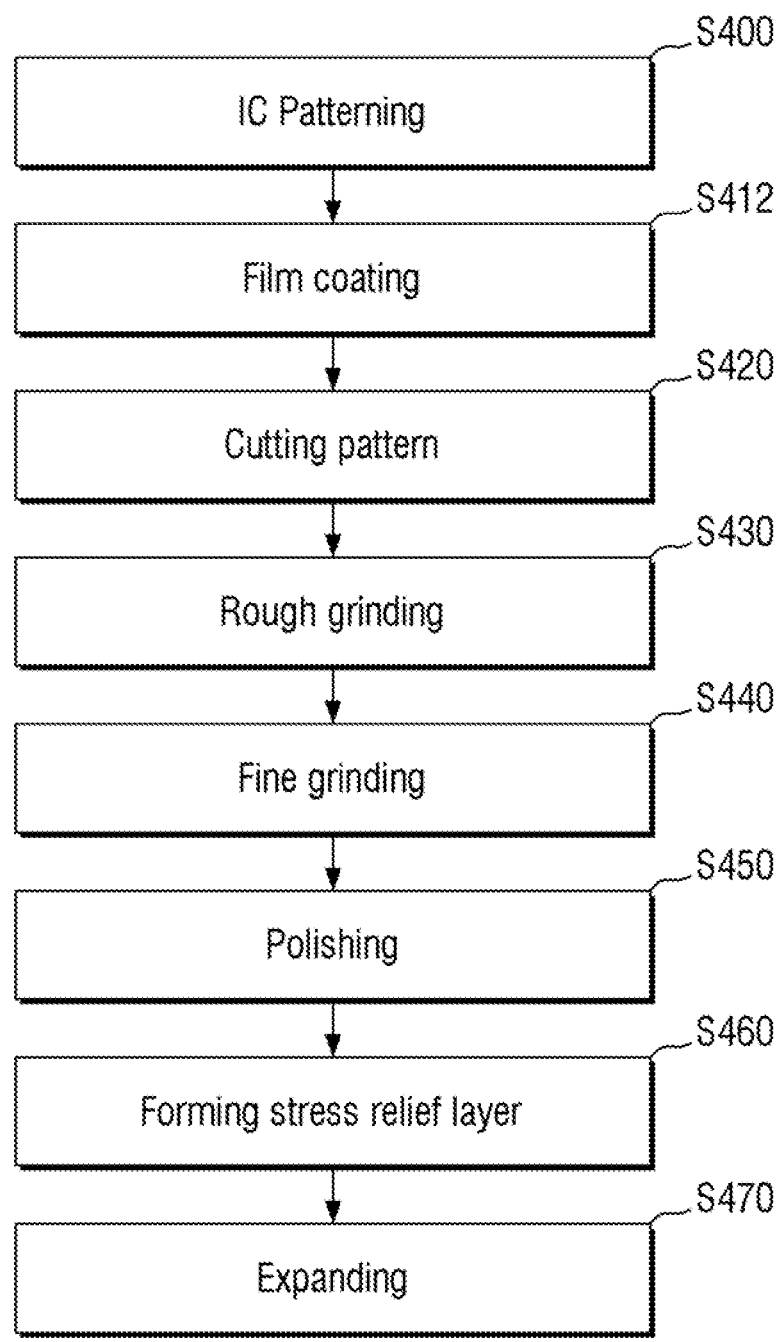
FIG. 11 is a flowchart illustrating a method for fabricating a semiconductor device according to an exemplary embodiment of the present disclosure.

FIG. 11 is a flowchart illustrating a method for fabricating a semiconductor device according to an exemplary embodiment of the present disclosure.

Referring to FIG. 11, since the steps S400 to S440 and the steps S460 to S470 of FIG. 11 are the same as the steps S300 to S360 of FIG. 9, the explanation thereof will not be provided.

After step S440, the wafer is polished (S450).

The step may be increased due to the high density and miniaturization of the semiconductor element and a multi-layered wiring structure. Various flattening methods such as, for example, a Spin on Glass (SOG), an ETCH BACK, and a REFLOW were developed to flatten the step. The developed methods are applied to the process of flattening the wafer. In the flattening process of the wafer, there are a mechanical polishing method and a chemical polishing method. In the mechanical polishing method, a work-affected layer is formed to become a defect on a semiconductor chip. In the chemical polishing method, although a work-affected layer is not generated, a flattened shape, that is, shape accuracy may not be obtained. Therefore, a flattening process for polishing a wafer by combining the mechanical polishing method and the chemical polishing method is required. As a result, a Chemical Mechanical Polishing (CMP) technique was developed.

The CMP process may allow the polishing table to which the polishing pad is attached to rotate. The polishing head simultaneously performs the rotary motion and the oscillating motion and may perform pressurization with a constant pressure. Thus, during the CMP process, both the polishing table and the polishing head are rotated and the polishing head is kept oscillating. The wafer may be mounted on the polishing head part by surface tension or vacuum. The wafer surface and the polishing pad may be brought into contact with each other by the self-weight of the polishing head and the applied pressure. A slurry that is a working fluid may flow in a fine gap between the contact surfaces CMP slurries usually include nano-sized abrasive particles dispersed in acidic or basic solution. Also, a mechanical removal action may be performed by the abrasive particles in the slurry and the surface protrusions of the pad. Further, a chemical removal action may be performed by chemical components in the slurry. Irregular wear of the polishing pad may occur when the polishing process by CMP is executed. Therefore, conditioning of the next polishing pad may be executed during polishing or after polishing. The polishing process of step S450 is not limited to CMP.

Figure 12:
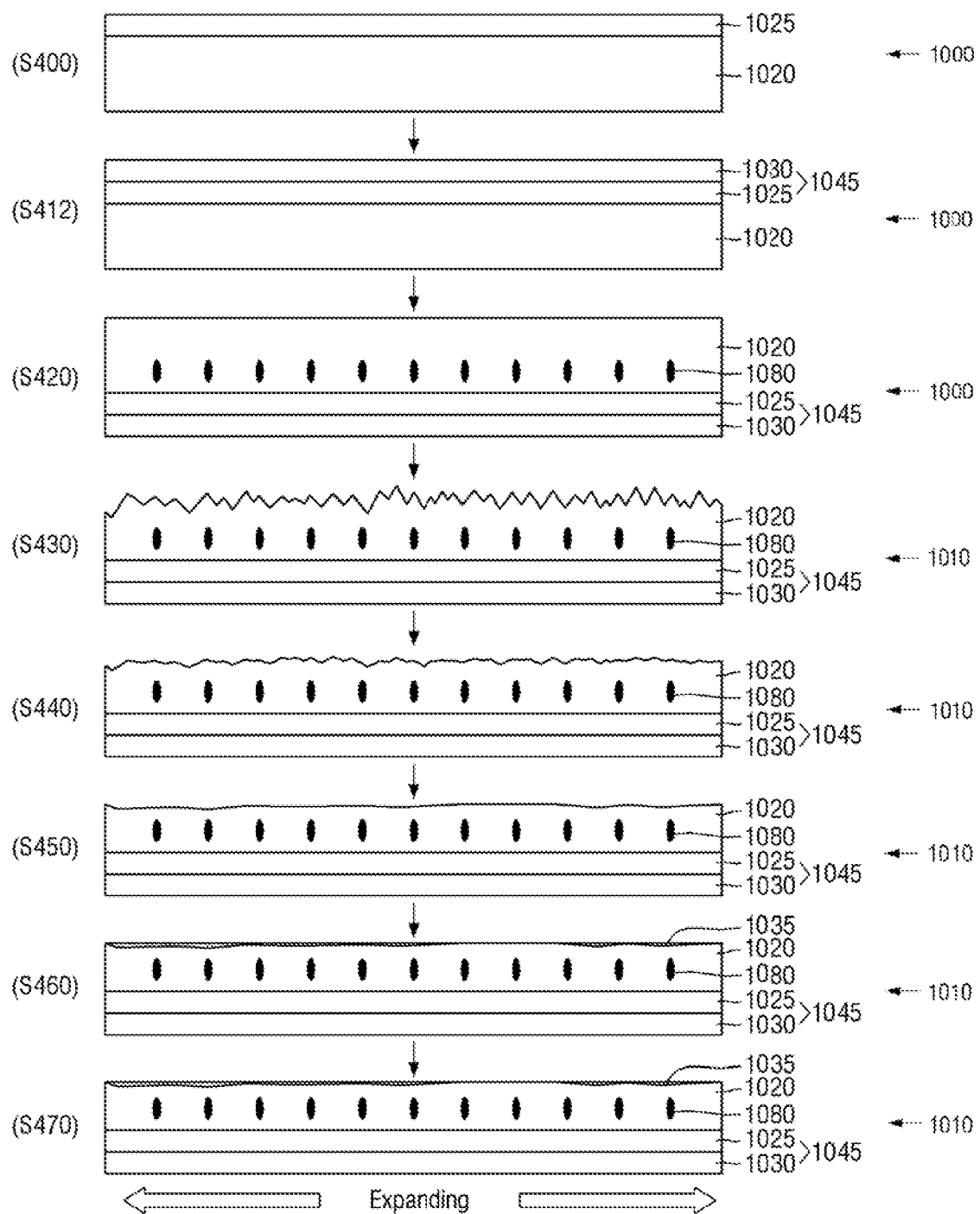
FIG. 12 is a flowchart illustrating a cross section of the wafer according to the process of FIG. 11.

FIG. 12 is a flowchart illustrating a cross section of the wafer according to the process of FIG. 11.

Referring to FIGS. 11 and 12, since the steps S400 to S440 and the steps S460 to S470 of FIG. 12 are the same as the steps S300 to S360 of FIG. 10, the explanation thereof will not be provided.

A first wafer 1000 may be made to a second wafer 1010 via the rough grinding (S430). The first wafer 1000 may include an element region 1045 (which may include an IC pattern 1025 and a film 1030), and a cutting pattern 1080. After the fine grinding (S440), a part of the base substrate 1020 of the second wafer 1010 is polished (S450). The slurry may be supplied between one side of the second wafer 1010 and a polishing pad. The polishing may be performed by relatively rotating the second wafer 1010 in contact with the polishing pad. The polishing process of step S450 is a CMP process, but the present disclosure is not limited thereto. The second wafer 1010 may include a stress relief layer 1035. Thus, the effect of stress suffered by expanding may be reduced by the stress relief layer 1035, and accurate dicing may be performed along the cutting pattern 1080 to divide the miniaturized semiconductor chip regions.

Figure 13:
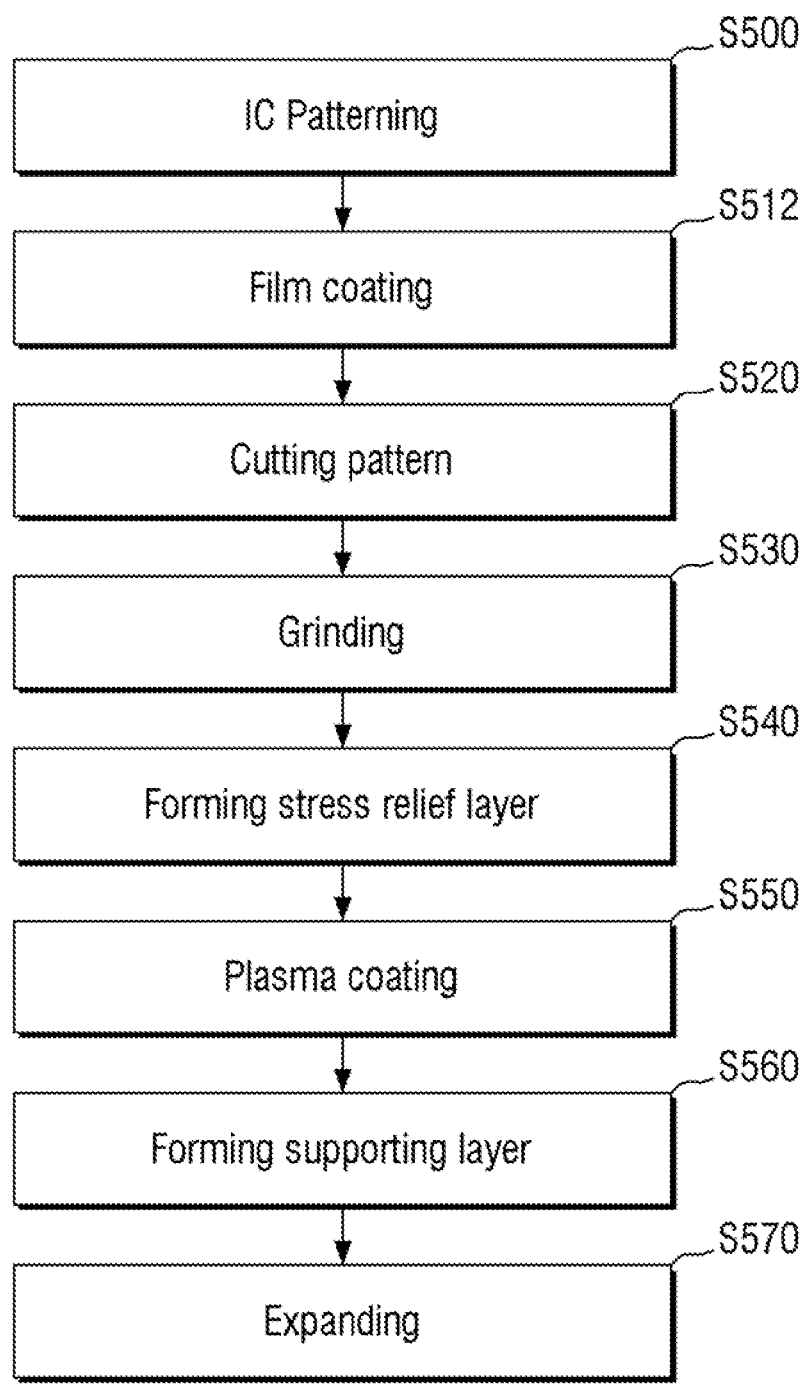
FIG. 13 is a flowchart illustrating a method for fabricating a semiconductor device according to an exemplary embodiment of the present disclosure.
Figure 14:
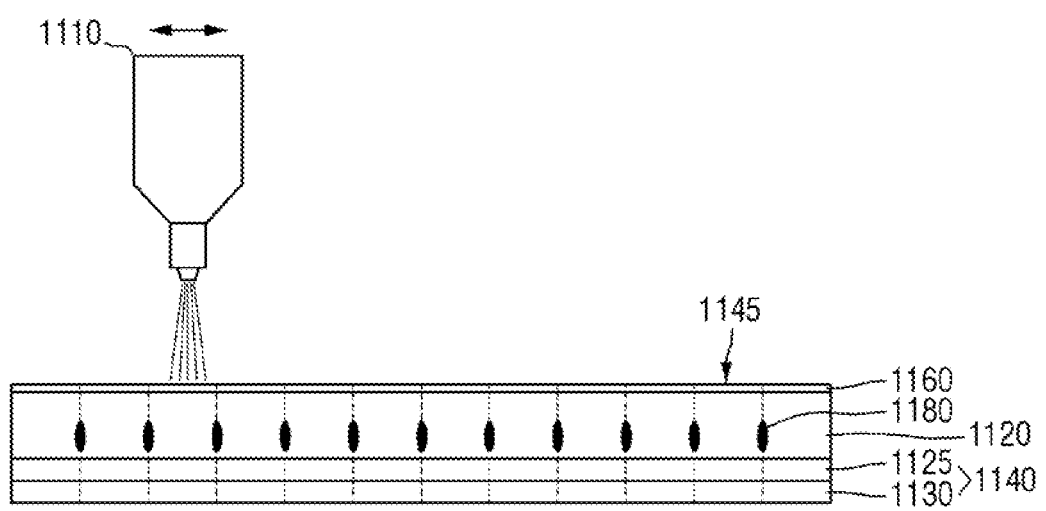
FIG. 14 is a view for explaining a method for coating the stress relief layer, using plasma.

FIG. 13 is a flowchart illustrating a method for fabricating a semiconductor device according to an exemplary embodiment of the present disclosure. FIG. 14 is a view for explaining a method for coating the stress relief layer, using plasma.

Referring to FIG. 13, since steps S500 to S540 and step S570 are the same as steps S200 to S250 of FIG. 3, the explanation thereof will not be provided.

After step 540, the stress relief layer is plasma-coated (S550).

Referring to FIG. 14, a plasma nozzle 1110 may administer a plasma beam to a stress relief layer 1160 formed on one side of a base substrate 1120 of a second wafer 1145, while moving. The second wafer 1145 may include an element region 1140 (which may include an IC pattern 1125 and a film 1130), and a base substrate 1120. The base substrate 1120 may include a cutting pattern 1180. Plasma coating includes, but is not limited to, atmospheric pressure plasma.

Coating using the plasma may use equipment of a relatively simple plasma nozzle 1110. Plasma is generated by the discharge, and the wettability of the surface of the stress relief layer 1160 may be enhanced chemically and physically. Further, a contact angle of the stress relief layer 1160 may be lowered. Therefore, the surface energy of the stress relief layer 1160 increases which may lead to an increase in the adhesive strength. This may facilitate coupling with a supporting film to be described later.

In the case of plasma of atmospheric pressure type, pretreatment is possible even if the plasma nozzle 1110, which is simpler than a vacuum type, is used. For example, no reaction chamber is needed to maintain a desired pressure such as, for example, a pressure higher than the atmosphere pressure or a pressure lower than the atmosphere pressure. In addition, since a discharge using high voltage is performed in the atmospheric pressure state, the initial facility cost may be reduced. Furthermore, a continuous pretreatment is possible. Therefore, the plasma pretreatment method, which places emphasis on high value added industries such as current IT and electronic industry, may be applied to polymer elements such as the stress relief layer 1160.

Referring again to FIG. 13, after step S550, a supporting film with brings the chips into contact with each other is formed on the plasma-coated stress relief layer (S560). The supporting film may be easily bonded to the stress relief layer with adhesive strength increased due to the plasma coating (S550). The supporting film may also be bonded to the element region.

The adhesive between the chips which has been applied to the existing general purpose package is a liquid adhesive which is formed in the form of epoxy/paste. The adhesive may use an adhesive dispensing method when bonding the individual chips to a substrate or a lead frame. A considerable process cost may be required by a dispensing process separately added for the chip bonding process. Besides cost, the adhesive dispensing method may have other reliability concerns. For example, it is difficult to control the application amount and thickness of the adhesive, due to the physical limitations and insufficient precision of the dispensing method. Also, it is difficult to maintain coating uniformity of the adhesive even after bonding between the chips.

A lamination technique of the chips is one of the major techniques that influence the utility and performance of semiconductor packages. If the interfacial adhesive strength between stacked chips is weak, the dimensional stability of the package may be lowered. In addition, the package may be easily deformed by stress such as external moisture or heat. Thus, a wire which is an electrical connection part may be damaged. Or, a front side of a chip with a circuit coated thereon may be damaged to significantly lower the reliability of the package. Therefore, it is necessary to replace the paste of the liquid application type conventionally used as the supporting film. A DAF may be used for the supporting film, as an interfacial adhesive that may faithfully bond the laminated chip interfaces according to these needs. However, the present disclosure is not limited thereto. The DAF may be epoxy adhesives or any other suitable adhesives, and is film based instead of the liquid application type paste described above. To attach the DAF to a wafer is through lamination process instead of dispensing process. Because there is no need to covert the liquid adhesive material from a drop-shape to a thin two-dimensional film, the process window for a film such as the DAF is much wider than for the liquid paste material.

In the chip bonding process via the DAF designed with excellent adhesion, the adhesive may be bonded to the back side of the wafer at the wafer processing step. Thereafter, the wafer dicing process immediately leads to the chip bonding process, and the adhesive may be directly bonded to the chip and the substrate or the lead frame.

Since the bonding process is performed from the wafer cutting step, there is no need for an independent bonding process such as the paste dispensing process. Also, a uniform thickness and a position of the DAF may be secured through a film shape of a solid shape. Therefore, drastic process unification through the DAF may be implemented. Further, the productivity of the packaging and the yield enhancement through the DAF may be obtained, FIG. 15 is a flowchart illustrating a cross section of the wafer according to the process of FIG. 13.

Figure 15:
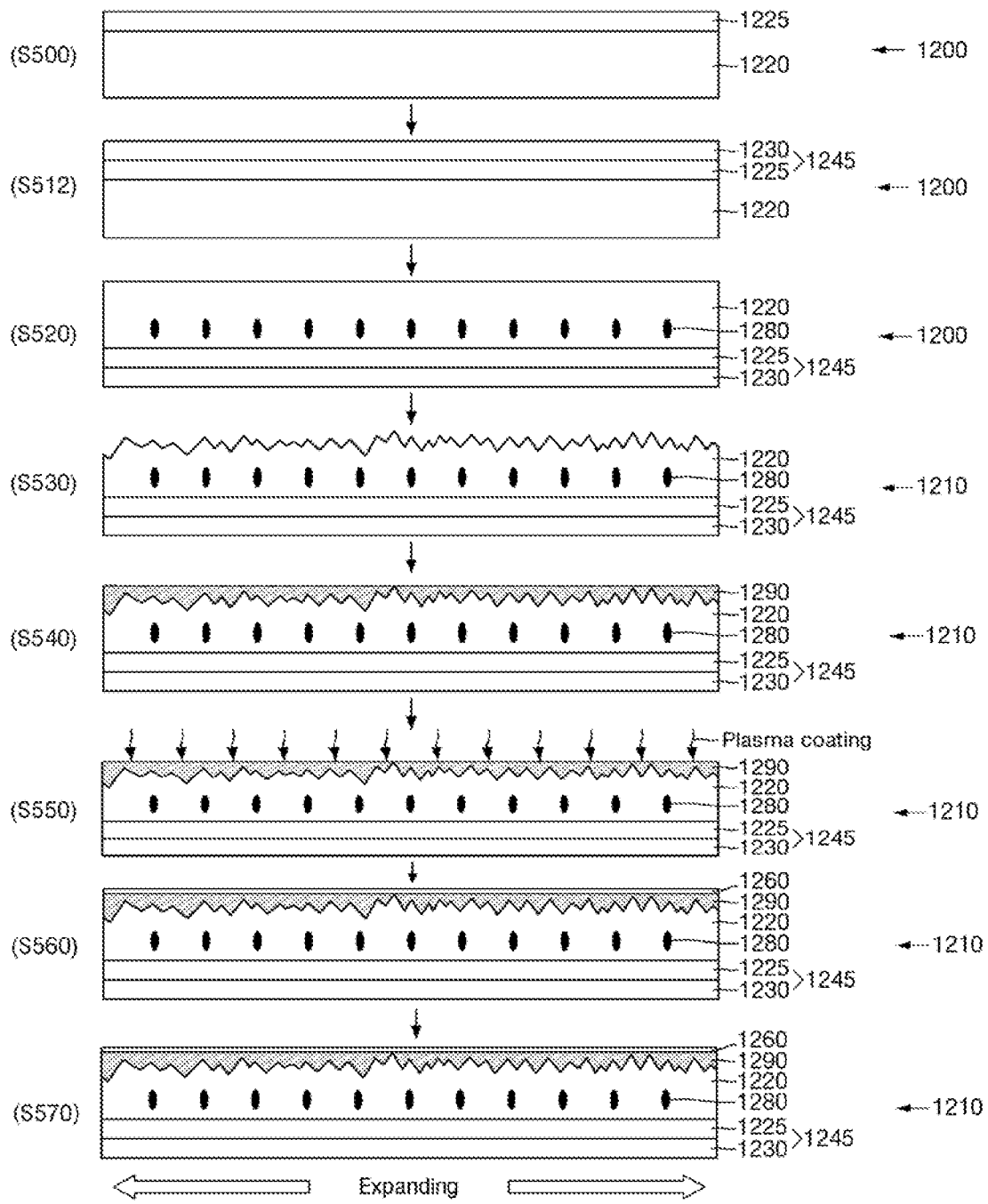
FIG. 15 is a flowchart illustrating a cross section of the wafer according to the process of FIG. 13.

Referring to FIGS. 13 and 15, since steps S500 to S540 and step S570 are the same as steps S200 to S250 of FIG. 8, the description thereof will not be provided.

The second wafer 1210 may be formed by grinding (S530) the first wafer 1200. The first wafer 1200 may include an element region 1245 (which may include an IC pattern 1225 and a film 1230), and a cutting pattern 1280. After step S540, a stress relief layer 1290 formed on one side of the base wafer 1220 of the second wafer 1210 is coated using plasma (S550). The second wafer 1210 may include the stress relief layer 1290.

After step S550, a supporting film 1260 for bonding the chips is formed on the coated stress relief layer 1290. The supporting film 1260 includes, but is not limited to, a DAF. The supporting film 1260 may be easily coupled with the stress relief layer 1290 by the plasma coating (S550). Thus, the effect of stress suffered by expanding may be reduced by the stress relief layer 1290, and accurate dicing may be performed along the cutting pattern 1280 to divide the miniaturized semiconductor chip regions.

In concluding the detailed description, those skilled in the art will appreciate that many variations and modifications may be made to the preferred exemplary embodiments without substantially departing from the principles of the present disclosure. Therefore, the disclosed preferred exemplary embodiments of the present disclosure are used in a generic and descriptive sense only and not for purposes of limitation.

While the present disclosure has been particularly shown and described with reference to exemplary embodiments thereof, it will be understood by those of ordinary skill in the art that various changes in form and details may be made therein without departing from the spirit and scope of the present disclosure as defined by the appended claims.

What is claimed is:

1. A method for fabricating a semiconductor device, the method comprising:
   providing a first wafer including a base substrate, which has a first surface and a second surface facing each other, and an element region disposed on the first surface of the base substrate;
   grinding a part of the base substrate to form a second wafer from the first wafer;
   forming a stress relief layer on the second surface of the ground base substrate of the second wafer;
   performing a post-treatment to the stress relief layer using a plasma process;
   forming a supporting film on the post-treated stress relief layer; and
   expanding the second wafer to dice the second wafer.

2. The method of claim 1, wherein the first wafer comprises a first semiconductor chip region and a second semiconductor chip region adjacent to each other, each including a portion of the base substrate and a portion of the element region, and
   the method further comprises forming a cutting pattern between the first semiconductor chip region and the second semiconductor chip region in the base substrate.

3. The method of claim 2, wherein the forming of the cutting pattern in the base substrate between the first semiconductor chip region and the second semiconductor chip region uses a laser.

4. The method of claim 1, wherein the grinding of a part of the base substrate comprises roughly grinding the part of the base substrate and then finely grinding the part of the base substrate.

5. The method of claim 4, further comprising:
after the finely grinding of the part of the base substrate, polishing the part of the base substrate.

6. The method of claim 1, wherein the stress relief layer comprises a polymer material.

7. The method of claim 1, wherein the stress relief layer has a thickness of about 500 nm or less with respect to the second wafer having a thickness of about 60 μm or less.

8. The method of claim 1, wherein the stress relief layer is formed on the second surface of the ground base substrate through a chemical vapor deposition.

9. A method for fabricating a semiconductor device, the method comprising:
providing a base substrate, which has a first surface and a second surface facing each other, in a first wafer which has an element region on the first surface of the base substrate, wherein the first wafer comprises a first semiconductor chip region and a second semiconductor chip region adjacent to each other, each including a portion of the base substrate and a portion of the element region;
forming a first supporting film on the element region;
forming a cutting pattern between the first semiconductor chip region and the second semiconductor chip region in the base substrate, using laser incident from the second surface of the base substrate;
grinding a part of the base substrate to form a second wafer from the first wafer after the forming of the cutting pattern;
forming a stress relief layer on the second surface of the ground base substrate;
performing post-treatment to the stress relief layer, using a plasma process;
forming a second supporting film on the post-treated stress relief layer; and
expanding the second wafer to separate the first semiconductor chip region and the second semiconductor chip region from each other.

10. The method of claim 9, wherein the grinding of a part of the base substrate comprises:
roughly grinding the part of the base substrate and then finely grinding the part of the base substrate; and
polishing the part of the finely ground base substrate.

11. The method of claim 9, wherein the stress relief layer comprises a polymer material.

12. The method of claim 9, wherein the stress relief layer has a thickness of about 500 nm or less with respect to the second wafer having a thickness of about 60 μm or less, and the stress relief layer is formed on the second surface of the ground base substrate through a chemical vapor deposition.

* * * * *